(12) United States Patent
Buhrman et al.

(10) Patent No.: US 9,576,631 B2
(45) Date of Patent: Feb. 21, 2017

(54) SPIN HALL EFFECT MAGNETIC APPARATUS, METHOD AND APPLICATIONS

(71) Applicant: Cornell University, Ithaca, NY (US)

(72) Inventors: Robert A. Buhrman, Ithaca, NY (US); Luqiao Liu, Ithaca, NY (US); Daniel C. Ralph, Ithaca, NY (US); Chi-Feng Pai, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 14/822,807

(22) Filed: Aug. 10, 2015

(65) Prior Publication Data

US 2015/0348606 A1 Dec. 3, 2015

Related U.S. Application Data

(63) Continuation of application No. 14/239,524, filed as application No. PCT/US2012/051351 on Aug. 17, 2012, now Pat. No. 9,105,832.

(Continued)

(51) Int. Cl.
| | |
|---|---|
| *G11C 11/00* | (2006.01) |
| *G11C 11/16* | (2006.01) |
| *G11C 11/18* | (2006.01) |
| *H01L 43/08* | (2006.01) |
| *H01L 43/12* | (2006.01) |
| *H01F 10/32* | (2006.01) |

(Continued)

(52) U.S. Cl.
CPC .......... *G11C 11/161* (2013.01); *G11C 11/1673* (2013.01); *G11C 11/1675* (2013.01); *G11C 11/18* (2013.01); *G11C 16/30* (2013.01); *H01F 10/3254* (2013.01); *H01F 10/3286* (2013.01); *H01L 43/04* (2013.01); *H01L 43/08* (2013.01); *H01L 43/12* (2013.01); *H01L 43/14* (2013.01)

(58) Field of Classification Search
USPC .................................................. 365/158, 148
See application file for complete search history.

(56) References Cited

U.S. PATENT DOCUMENTS

| | | | |
|---|---|---|---|
| 6,683,359 B2 | 1/2004 | Johnson et al. | |
| 7,476,954 B2 * | 1/2009 | Wang ..................... | B82Y 10/00 257/295 |

(Continued)

FOREIGN PATENT DOCUMENTS

JP 2010062531 A 3/2010

*Primary Examiner* — Anthan Tran
(74) *Attorney, Agent, or Firm* — Perkins Coie LLP

(57) ABSTRACT

An ST-MRAM structure, a method for fabricating the ST-MRAM structure and a method for operating an ST-MRAM device that results from the ST-MRAM structure each utilize a spin Hall effect base layer that contacts a magnetic free layer and effects a magnetic moment switching within the magnetic free layer as a result of a lateral switching current within the spin Hall effect base layer. This resulting ST-MRAM device uses an independent sense current and sense voltage through a magnetoresistive stack that includes a pinned layer, a non-magnetic spacer layer and the magnetic free layer which contacts the spin Hall effect base layer. Desirable non-magnetic conductor materials for the spin Hall effect base layer include certain types of tantalum materials and tungsten materials that have a spin diffusion length no greater than about five times the thickness of the spin Hall effect base layer and a spin Hall angle at least about 0.05.

17 Claims, 18 Drawing Sheets

Related U.S. Application Data

(60) Provisional application No. 61/619,679, filed on Apr. 3, 2012, provisional application No. 61/545,705, filed on Oct. 11, 2011, provisional application No. 61/534,517, filed on Sep. 14, 2011, provisional application No. 61/524,998, filed on Aug. 18, 2011.

(51) Int. Cl.
*G11C 16/30* (2006.01)
*H01L 43/04* (2006.01)
*H01L 43/14* (2006.01)

(56) References Cited

U.S. PATENT DOCUMENTS

| | | | |
|---|---|---|---|
| 2003/0179510 A1* | 9/2003 | Hayakawa | B82Y 10/00 360/324.1 |
| 2008/0150640 A1* | 6/2008 | Dimitrov | H03B 15/006 331/3 |
| 2009/0161265 A1 | 6/2009 | Sugano et al. | |
| 2010/0027330 A1 | 2/2010 | Koo et al. | |
| 2010/0097063 A1 | 4/2010 | Ando et al. | |
| 2011/0303960 A1* | 12/2011 | Cao | C23C 14/165 257/315 |

* cited by examiner

TUNGSTEN

- α-W
  - BCC
  - CONDUCTIVE (20-40 μΩ·cm)
  - STABLE

- β-W
  - A15 CUBIC (W$_3$W)
  - RESISTIVE (150-350 μΩ·cm)
  - METASTABLE

SPIN HALL EFFECT MAGNETIC APPARATUS, METHOD AND APPLICATIONS

CROSS-REFERENCE TO RELATED APPLICATION

This application is related to, and derives priority from: (1) U.S. Provisional Patent Application Ser. No. 61/524,998, filed Aug. 18, 2011; (2) U.S. Provisional Patent Application Ser. No. 61/534,517, filed Sep. 14, 2011; (3) U.S. Provisional Patent Application Ser. No. 61/545,705, filed Oct. 11, 2011; and (4) U.S. Provisional Patent Application Ser. No. 61/619,679, filed Apr. 3, 2012, each titled Spin Hall Effect Apparatus, Method and Applications, the content of each of which provisional patent application is incorporated herein fully by reference.

STATEMENT OF GOVERNMENT INTEREST

The research that lead to the embodiments as disclosed herein and the invention as claimed herein was funded by the United States Army Research Office under award W911NF-08-2-0032, the United States Defense Advanced Research Project Agency, under award HR0011-11-C-0074, and the United States Office of Naval Research under award N00014-10-1-0024. The United States Government has rights in the invention claimed herein.

BACKGROUND

Field of the Invention

Embodiments relate generally to magnetic memory devices, such as but not limited to magnetic random access memory (MRAM) devices. More specifically, embodiments relate to magnetic memory devices, such as but not limited to magnetic random access memory (MRAM) devices, with enhanced performance.

Description of the Related Art

Magnetic random access memory (MRAM) devices comprise a class of non-volatile, fast and energy-efficient data storage devices that are expected to be capable of achieving very high levels of magnetic data density. Each MRAM cell stores one binary bit of data. A central component of an MRAM device cell is a thin film magnetoresistive element, which is a combination of thin film materials whose electrical resistance depends upon the relative magnetic orientation of two or more, but generally only two, thin film ferromagnetic material layers. One of the thin film ferromagnetic material layers typically has a fixed magnetic orientation and is referred to as a pinned layer (PL), while the other of the thin film ferromagnetic material layers has a switchable magnetic orientation and is referred to as a free layer (FL).

A further sub-category of MRAM devices is spin-torque MRAM (ST-MRAM) devices. In comparison with more conventional MRAM devices, ST-MRAM devices utilize a spin torque generated by an electrical current (i.e., rather than a magnetic field generated by an electrical current) to switch the relative magnetic orientation of a free layer (FL) with respect to a pinned layer (PL).

As integrated circuit device dimensions have decreased and integrated circuit device density has increased, it has become desirable to provide more efficient and more reliable MRAM structures including ST-MRAM structures, as well as methods for fabrication thereof and operation thereof for the more efficient and more reliable MRAM structures including the ST-MRAM structures.

SUMMARY

Embodiments provide an ST-MRAM structure, a method for fabricating the ST-MRAM structure and a method for operating an ST-MRAM device that results from the ST-MRAM structure.

The ST-MRAM structure and related methods in accordance with the embodiments use a base layer having an enhanced spin Hall effect (i.e., a spin Hall effect base layer (SHE base layer)) which is located and formed contacting a free layer within the ST-MRAM structure. The ST-MRAM structure and related methods in accordance with the embodiments are predicated upon use of a lateral switching current applied with respect to the SHE base layer that provides for magnetic alignment switching within the free layer. A sensing current and a sensing voltage may be measured or applied perpendicularly through a thin film magnetoresistive element stack that sequentially comprises a pinned layer, a non-magnetic spacer layer and the free layer that contacts the SHE base layer within the ST-MRAM structure.

Thus, the ST-MRAM structure and device in accordance with the embodiments provide for: (1) an in-plane lateral switching current within an SHE base layer that switches a magnetic orientation of a free layer with respect to a pinned layer; in conjunction with (2) a perpendicular to plane sensing current and sensing voltage through a thin film magnetoresistive element stack comprising the pinned layer, a non-magnetic spacer layer and the free layer (that contacts the SHE base layer), when operating the ST-MRAM structure and device.

To achieve the foregoing results, an SHE base layer within an ST-MRAM structure and device in accordance with the embodiments comprises a non-magnetic conductor material that has: (1) a spin Hall angle greater than about 0.05 (and more preferably greater than about 0.10); and (2) a maximum thickness no greater than about 5 times a spin diffusion length (and more preferably from about 1.5 to about 3 times the spin diffusion length) within the non-magnetic conductor material. For device geometries in which the equilibrium magnetization of the magnetic free layer is in the sample plane, the non-magnetic conductor material with the foregoing spin Hall angle should also have the property that: (3a) its presence adjacent to and contacting the magnetic free layer increases a magnetic damping of the magnetic free layer by no more than a factor of 2 above an intrinsic value for the magnetic free layer material. For device geometries in which the equilibrium magnetization of the magnetic free layer is perpendicular to the sample plane, the non-magnetic conductor material with the foregoing spin Hall angle should have the property that: (3b) the interface between it and the magnetic free layer contributes a perpendicular magnetic anisotropy to the magnetic free layer that allows the anisotropy energy of the magnetic free layer to achieve an optimized value between 40 $k_B T$ and 300 $k_B T$, where $k_B$ is the Boltzmann constant and T is the temperature.

The embodiments thus comprise a magnetic tunnel junction that allows a sensing current to flow perpendicular to the plane of a plurality of films, and an adjacent non-magnetic metallic strip comprising a material having a comparatively strong spin Hall effect (SHE) that can carry current flowing in the film plane. Metallic elements that have a comparatively large spin Hall angle include but are not limited to Ta and W, as is discussed further below. Ta and W in their high-resistivity beta phases are particularly suited for manipulating in-plane polarized magnetic free layers, while Ta and W in their high-resistivity beta phases as well as Pt are suited for manipulating magnetic free layers with their magnetization oriented perpendicular to the thin film plane. Alloys of these and other elements can be formed that also have strong SHE effects and can be used within the context of the embodiments. The magnetic tunnel junction is comprised of a ferromagnetic layer with fixed magnetization direction (i.e., the pinned layer (PL)), another ferromagnetic layer that has a magnetization which is free to rotate under spin current or magnetic field (i.e., the free layer (FL)), and a tunneling barrier or a non-magnetic metal layer (i.e. the non-magnetic spacer layer) that separates the free layer and the pinned layer. The SHE base layer that comprises the non-magnetic strip is in contact with the free magnetic layer and is located on the opposite side of the free layer/tunneling barrier interface. The write current flows laterally in the nonmagnetic strip SHE base layer without any substantial portion of the write current passing through the tunnel barrier, while the read or sense current is applied across the magnetic tunnel junction. The magnetic tunnel junction may also include other layers, for example, the pinned magnetic layer can be pinned with either an antiferromagnetic layer, or by a synthetic antiferromagnetic tri-layer consisting of two thin ferromagnetic layers separated by a thin non-magnetic layer such as Ru of a thickness that results in anti-parallel magnetic alignment of the two magnetic layers by the indirect exchange interaction, or by some other magnetic pinning method; and/or both the pinned and free magnetic layers may comprise synthetic antiferromagnetic layers or other ferromagnetic multilayers.

For a material with a strong spin Hall effect (SHE), and while not being bound by any particular theory, when there is a charge current flowing longitudinally, the so-called spin-orbit coupling between the electrons in the current and the ions in the metal causes electrons that have their spin in one orientation to be preferentially deflected into one direction transverse to the current, while electrons with the opposite spin are deflected in the opposite transverse direction. The net result is a "spin current" of electrons flowing transverse to the charge current. The spin current direction is determined by the cross product of the spin orientation and the direction of charge current flow. When the spin polarized electrons that form this spin current reach the interface between the non-magnetic layer SHE base layer where the SHE is generated and the FL, these electrons will exert a spin torque on the FL, whereby the magnetization of the FL can be rotated or switched. Since the spin Hall effect occurs in a very thin layer that is immediately adjacent to (i.e., adjoining) the FL, there is no significant loss of spin current by diffusion out the electrical leads. Moreover, the spin Hall effect is superior in the efficiency of generating spin current since it allows torques corresponding to more than one unit of transferred spin (h/4 pi) per electron in the current (where h is Planck's constant and pi is the fundamental constant determined by the ratio of the circumference of a circle to its diameter). The conventional method of producing spin currents via spin filtering in a magnetic tunnel junction or magnetic spin valve is limited to torques corresponding to strictly less than one unit of transferred spin (h/4 pi) per electron in the current. As a result, by using the SHE one can switch a magnet with smaller currents and energy costs compared with the conventional current induced switching, thereby improving device efficiency. Compared to conventional current induced switching in magnetic tunnel junctions, the SHE device geometry also provides a separation of the current paths for reading and writing, which greatly improves the device reliability, presently the main obstacle to ST-MRAM commercialization.

To read the data stored in a ST-MRAM memory cell in accordance with the embodiments, current is applied perpendicularly across the magnetic tunnel junction. Since the magnetization of the FL and PL can be either parallel or antiparallel, due to tunneling magnetoresistance the memory cell will be either in the low resistance state or the high resistance state, where one of these two states can represent the binary data 0 and the other state the binary data 1.

A particular ST-MRAM structure in accordance with the embodiments includes a spin Hall effect base layer located over a substrate. The particular structure also includes a magnetic free layer located over the substrate and contacting the spin Hall effect base layer. Within the structure, a non-magnetic conductor material that comprises the spin Hall effect base layer has: (1) a spin Hall angle greater than about 0.05; and (2) a thickness no greater than about 5 times a spin diffusion length in the non-magnetic conductor material.

Another particular ST-MRAM structure in accordance with the embodiments includes a spin Hall effect base layer located over a substrate and including two laterally separated terminals. This other particular structure also includes a magnetoresistive stack located contacting the spin Hall effect base layer and comprising: (1) a magnetic free layer located contacting the spin Hall effect base layer; (2) a non-magnetic spacer layer located over the magnetic free layer; and (3) a pinned layer located over the non-magnetic spacer layer. This other particular structure also includes a third terminal electrically connected to the pinned layer. Within this other particular structure, a non-magnetic conductor material that comprises the spin Hall effect base layer has: (1) a spin Hall angle greater than about 0.05; and (2) a thickness no greater than about 5 times a spin diffusion length in the non-magnetic conductor material.

A particular method for fabricating the ST-MRAM structure in accordance with the embodiments includes forming over a substrate a spin Hall effect base layer comprising a non-magnetic conductor material having: (1) a spin Hall angle greater than about 0.05; and (2) a thickness no greater than about 5 times a spin diffusion length in the non-magnetic conductor material. The particular method also includes forming over the substrate and contacting the spin Hall effect base layer a magnetic free layer.

A particular method for operating the ST-MRAM structure in accordance with the embodiments includes providing a magnetic structure comprising: (1) a spin Hall effect base layer located over a substrate and including two laterally separated terminals; (2) a magnetoresistive stack located contacting the spin Hall effect base layer and comprising: (a) a magnetic free layer located contacting the spin Hall effect base layer; (b) a non-magnetic spacer layer located over the magnetic free layer; and (c) a pinned layer located over the non-magnetic spacer layer; and (3) a third terminal electrically connected to the pinned layer. Within this method, a non-magnetic conductor material that comprises the spin Hall effect base layer has: (1) a spin Hall angle greater than about 0.05; and (2) a thickness no greater than about 5 times a spin diffusion length in the non-magnetic conductor material. This method also includes applying a switching current to the two laterally separated terminals to switch a magnetic direction of the free layer with respect to the pinned layer.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

Figure 1:
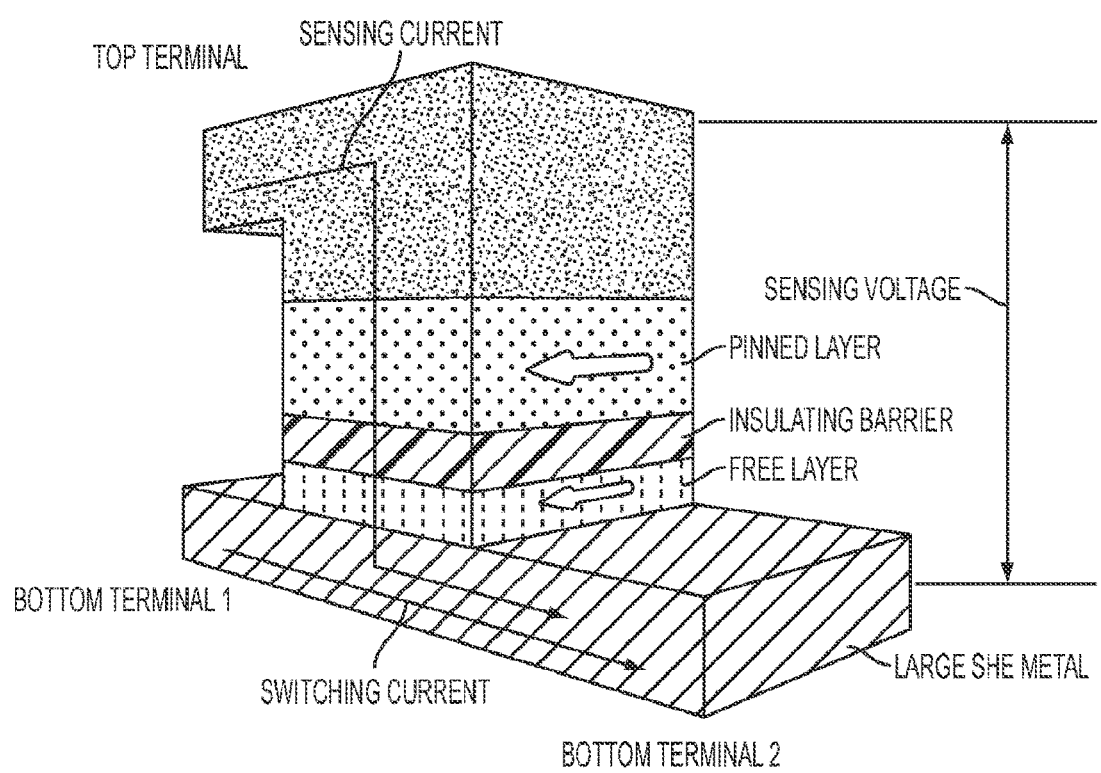
FIG. 1 shows a schematic perspective-view diagram illustrating a three terminal ST-MRAM device cell that employs the SHE for a writing operation in accordance with the embodiments. The ST-MRAM cell is comprised of a magnetic tunnel junction and a non-magnetic strip with a strong SHE. In this particular embodiment, the non-magnetic strip is located on the bottom of the device structure.
Figure 2:
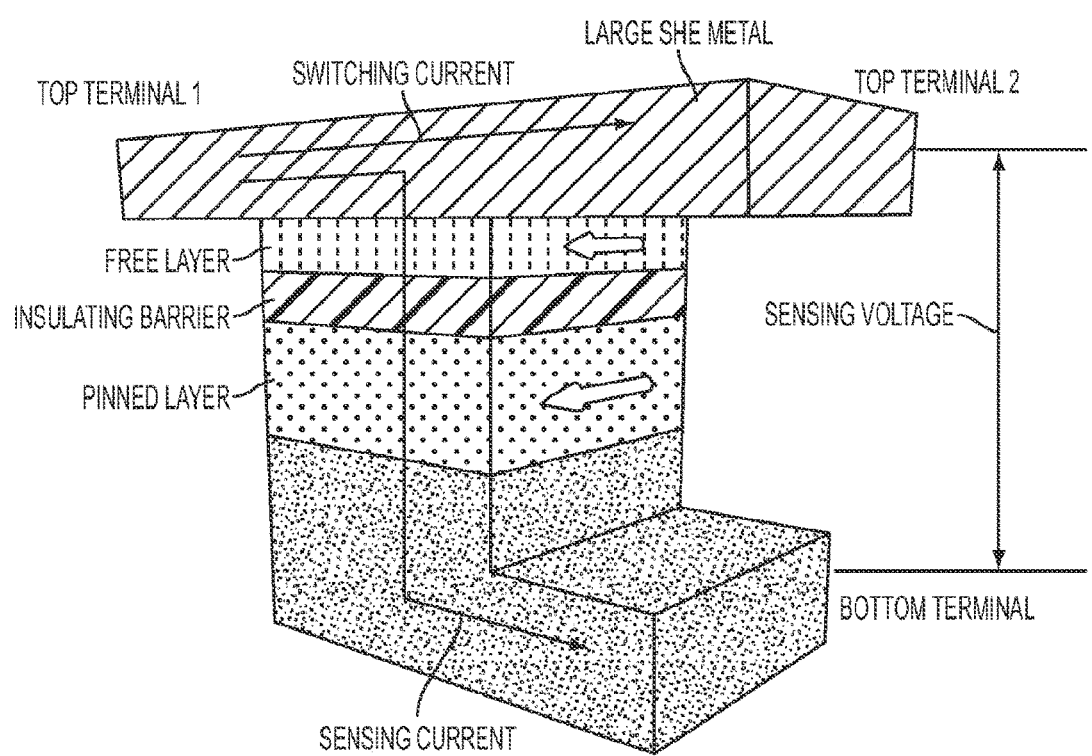
FIG. 2 shows an alternate embodiment of the embodiment illustrated in FIG. 1, where the non-magnetic strip with the strong SHE is located on the top of the ST-MRAM device structure.

Embodiments include a spin torque magnetic random access memory (ST-MRAM) structure, a method for fabricating the ST-MRAM structure and a method for operating a ST-MRAM device that results from the ST-MRAM structure. The ST-MRAM structure and device in accordance with the embodiments use a spin Hall effect base layer located and formed contacting a free layer within the ST-MRAM structure and device so that a lateral current through the SHE base layer may be used to switch a magnetic orientation of a free layer with respect to a pinned layer while measuring or applying a sense voltage and a sense current perpendicularly through a magnetoresistive element stack that comprises the pinned layer, a non-magnetic spacer layer and the free layer that contacts the spin Hall effect base layer.

The embodiments contemplate that specific materials may be used for the spin Hall effect base layer, such as but not limited to Ta and W, with the high-resistivity beta forms of Ta and W being particularly desirable within the context of particular materials characteristics. Additional candidate materials that may comprise the spin Hall effect base layer include, but are not limited to, Pt, Pd, Nb, Mo, Ru, Re, Os, Ir, Au, Tl, Pb, Bi as well as the alloys based upon those transition metals such as $Cu_{1-x}Bi_x$, $Ag_{1-x}Bi_x$, $Cu_{1-x}Ir_x$, $Ag_{1-x}Ir_x$, $Cu_{1-x}W_x$, $Ag_{1-x}W_x$, $Cu_{1-x}Ta_x$, $Ag_{1-x}Ta_x$, and high resistivity compounds that incorporate one or more elements with high atomic number, such as compounds with the A15 crystal structure such as $Ta_3Al$, $Nb_3Sn$, $W_3Ge$, and other compounds such as TaN, WN and NbN.

I. Exemplary Selection Criteria for a Non-Magnetic Conductor Material for a Spin Hall Effect Base Layer within an ST-MRAM Structure and Device in Accordance with the Embodiments The embodiments relate to ST-MRAM structures and devices generally in accordance with FIG. 1, FIG. 2, FIG. 3, FIG. 10, FIG. 12 and FIG. 13, which utilize a spin Hall effect base layer which contacts a free layer within an ST-MRAM structure. As described above, the ST-MRAM structure and related device provides for a lateral switching current within the spin Hall effect base layer for purposes of effecting a magnetic spin transition within the free layer that contacts the spin Hall effect base layer. A sensing voltage or a sensing current may then be utilized to read separately and perpendicularly though either a magnetoresistive tunneling junction, or a magnetic spin valve, that comprises sequentially layered a pinned layer, a non-magnetic spacer layer and the free layer that contacts the spin Hall effect base layer, to determine a 0 data state or a 1 data state within the magnetoresistive tunneling junction.

In general, the spin Hall base layer in accordance with the embodiments may comprise any of several non-magnetic conductor materials, including but not limited to tantalum and tungsten, although other non-magnetic conductor materials as pure metals and metal alloys and compounds are not precluded within the context of the embodiments, as further described above.

A first characteristic of the non-magnetic conductor material from which is comprised the spin Hall effect base layer is a relatively large spin Hall angle; values greater than 0.05, and more preferably greater than about 0.1, will generally be needed for practicable devices. The spin Hall angle denotes a conversion efficiency between a charge current density and a spin current density within the non-magnetic conductor material that comprises the spin Hall effect base layer. As noted in detail below, this is an intrinsic property of conducting materials and thus should be measured for each specific material using the spin torque FMR technique or direct switching experiments.

Moreover, when selecting a non-magnetic conductor material for the spin Hall effect base layer, the embodiments contemplate that such a non-magnetic conductor material be selected to have a thickness no greater than about 5 times the spin diffusion length for the non-magnetic conductor material that comprises the spin Hall effect base layer. The spin diffusion length denotes the length scale over which a non-equilibrium spin polarization of the conduction electrons in a non-magnetic metal decays exponentially to zero by spin flip scattering processes. Such a spin diffusion length can be measured, e.g., by using the spin torque FMR technique with a series of samples having different thicknesses for the spin Hall effect base layer. Such a maximum thickness is governed by the consideration that the switching current increases linearly with the thickness of the SHE base layer when this thickness is much larger than its spin diffusion length.

Additional considerations for selecting a non-magnetic conductor material for the spin Hall effect base layer will differ depending on whether the equilibrium magnetization orientation of the magnetic free layer is in the sample plane or perpendicular to this plane. If the free layer magnetization is in-plane, the spin Hall torque can drive magnetic switching by modifying the effective magnetic damping of the free layer. To achieve this result, the spin-Hall material should be chosen so that in the absence of current it does not increase the magnetic damping of the free layer by more than a factor of two above its intrinsic value. Ta and W satisfy this criterion, but other materials with strong spin-orbit coupling such as Pt do not. If the free layer magnetization is perpendicular to the sample plane, the spin Hall torque can achieve switching by overcoming a torque due to the perpendicular anisotropy. To achieve this result, the spin-Hall materials should be chosen so that it contributes to the perpendicular magnetic anisotropy of the free layer to provide a total magnetic anisotropy energy in the range between $40\,k_BT$ and $300\,k_BT$, so that the magnetic free layer has thermal stability but can still be switched at low values of applied current. W, Ta, and Pt can all satisfy these criteria.

In concert with the above materials selection considerations for a non-magnetic conductor material from which may be comprised the spin Hall base layer within an ST-MRAM structure and device in accordance with the embodiments, the data for candidate materials platinum, tantalum and tungsten is illustrated as follows in Table I.

TABLE I

| Metal | SD Length | SHE Angle |
|-------|-----------|-----------|
| W | ~1 nm | 0.2-0.3 |
| Ta | ~1 nm | 0.15 |
| Pt | 1.4 nm | 0.06 |

II. General Considerations Related to ST-MRAM Structures and Devices in Accordance with the Embodiments The embodiments utilize the spin Hall effect as a writing mechanism for a practical three terminal ST-MRAM device. To illustrate the basic concept, FIG. 1 in particular shows a schematic cross-sectional diagram of the three terminal ST-MRAM device structure, where the SHE is employed as the writing mechanism and an MTJ structure is employed to read out the data which is stored via the magnetic orientation of a free layer FL within a magnetic tunnel junction with respect to a pinned layer within the magnetic tunnel junction.

Within the ST-MRAM in accordance with the embodiments, the magnetic tunnel junction comprises a pillar-shaped magnetoresistive element and component with a lateral dimension generally in the sub-micron or nanometer range (i.e., from about 10 nanometer to about 500 nanometer). A free ferromagnetic layer with a magnetic moment $\vec{m}_1$ is made of soft ferromagnetic material with small to medium coercive field, generally in a range from about 10 to about 5000 Oersted. Typical thicknesses for the free layer range from 0.5 nanometer to about 3 nanometers. A pinned ferromagnetic layer with magnetic moment $\vec{m}_2$ is made of soft or hard ferromagnetic material with a large coercive field, generally in a range from about 100 to about 20000 Oersted, or pinned by additional antiferromagnetic layers. Typical thicknesses for the pinned magnetic layers range from 4 nanometer to about 50 nanometers. The FL and the PL are separated by a non-magnetic spacer layer, and the non-magnetic spacer layer is comprised of an insulating oxide material, or alternatively a non-magnetic metal such as Cu or Ag. A thickness of the non-magnetic spacer layer usually ranges from about 0.5 nanometer to about 50 nanometers. Typical materials for the magnetic layers may include (but are not limited to) Fe, Co, Ni, alloys of these elements, such as $Ni_{1-x}Fe_x$, alloys of these elements with a non-magnetic material, such as $Fe_{1-x}Pt_x$ and $Co_xFe_yB_{1-(x+y)}$, and ferromagnetic multilayers made from those materials, such as $(Co/Ni)_n$, $(Co/Pt)_n$, and (Co/Pd) where n represents the repeat number of the multilayer. Typical oxide materials for the non-magnetic spacer layer may include (but are not limited to) magnesium oxide (MgO), boron doped magnesium oxide (Mg(B)O), stoichiometric and non-stoichiometric aluminum oxide ($Al_2O_3$ and $AlO_x$), titanium oxide, tantalum oxide, hafnium oxide, boron nitride and silicon oxide.

In contact with the FL of the magnetic tunnel junction is a non-magnetic thin-film strip made of one of a variety of possible materials that exhibit a strong spin Hall effect (SHE) (i.e., a spin Hall effect base layer). The non-magnetic strip is patterned into nanometer scale or micrometer scale wires. Typical materials with strong SHE may include (but are not limited to) Ta, W, Pt, alloys and compounds that incorporate these or other high atomic number elements, and alloys such as $Cu_{1-x}Ir_x$, $Cu_{1-x}Bi_x$.

As is shown in FIG. 1, three terminals of the ST-MRAM structure are formed where electrical connections may be made to the structure. One terminal is on the pillar, close to the PL of the MTJ, and the other two terminals are the two ends of the non-magnetic strip that comprises the spin Hall effect base layer. Writing current is applied between the two terminals on the non-magnetic strip while reading current is applied between the terminal on the pillar and either one of the two terminals on the non-magnetic strip that comprises the SHE base layer.

The schematic perspective view diagram shown in FIG. 1 gives the relative location of each layer but does not necessarily reflect their exact positions. For example, the FL of the MTJ can be either at the bottom of the pillar, as shown in FIG. 1 or on the top of the pillar, as is in FIG. 2. But in any case the non-magnetic strip with the strong SHE is always adjacent to (and typically adjoining) the FL. When the FL is at the bottom, the non-magnetic strip is also at the bottom of the device structure, next to a substrate (i.e., which is not illustrated) over which is located and formed all of the material layers within the ST-MRAM in accordance with the embodiments. When the FL is on the top, the PL is located and formed on the substrate side of the tunnel barrier, the FL is above the tunnel barrier, and the non-magnetic strip that comprises the SHE base layer is located on the top of the ST-MRAM device.

Figure 3:
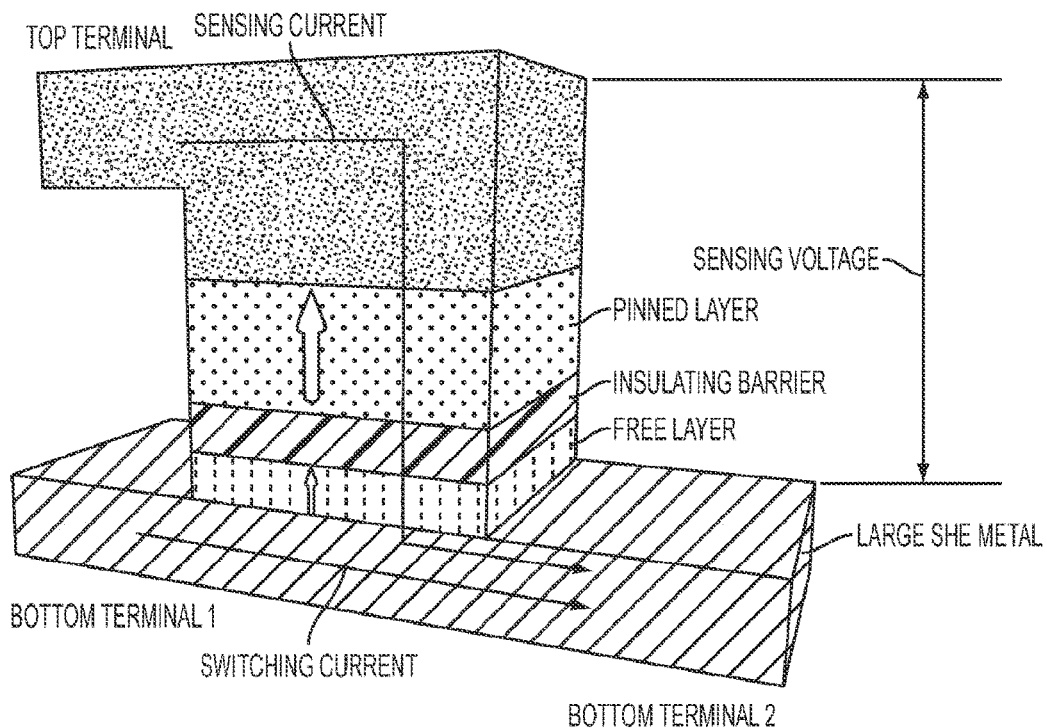
FIG. 3 shows another alternate embodiment of the embodiment illustrated in FIG. 1, where the equilibrium positions of the magnetic moments of the FL and PL are perpendicular to the film plane.
Figure 4:
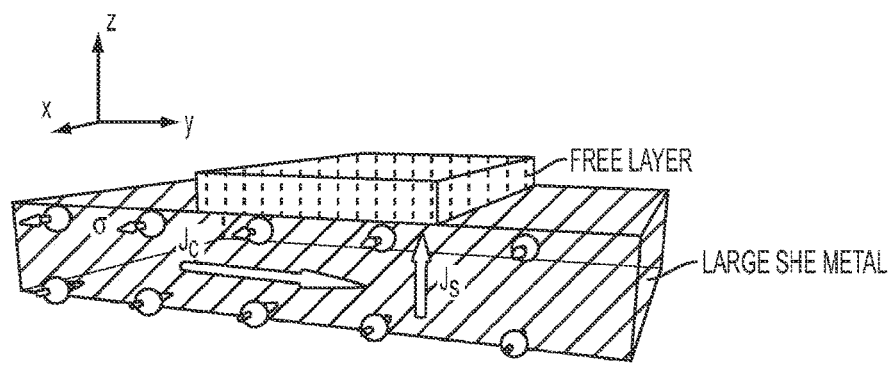
FIG. 4 shows the direction of the injected spin σ, as well as the flowing direction of the charge current $J_c$ and spin current $J_s$.

The equilibrium orientation of magnetic moments of the FL and PL $\vec{m}_1$, $\vec{m}_2$ can be either in the film plane as is illustrated in FIG. 1, or perpendicular to the film plane as is illustrated in FIG. 3. The injected spins from the SHE are always oriented in the film plane and perpendicular to the flowing direction of the current in the non-magnetic strip, as illustrated in FIG. 4. The orientation of the injected spins is determined by the formula $\vec{J}_s \propto \theta_{SH} \vec{\sigma} \times \vec{J}_c$. Here, $\vec{\sigma}$ is the direction of the injected spin moments (not the angular momenta) and $\theta_{SH}$ is the spin Hall angle, which is a parameter intrinsic to each material and quantifies the magnitude of the SHE in that specific material. Since the FL is either above or under the non-magnetic strip carrying the charge current $J_c$, the spin current $\vec{J}_s$ is either flowing along the +z or −z direction in FIG. 4. Therefore, according to the formula above, the injected spin $\vec{\sigma}$ is either along the +x or −x direction, depending on the direction of $J_c$ and the sign of the spin Hall angle $\theta_{SH}$.

When $\vec{m}_1$ and $\vec{m}_2$ are in plane, and perpendicular to the current direction mentioned above (i.e. along +/−x axis direction), $\vec{m}_1$ is collinear (either parallel or anti-parallel) with the injected spins from the SHE $\vec{\sigma}$. In this case the injected spins act as an effective magnetic damping which depending upon the orientation of the spin can be of either sign, i.e. either positive or negative damping. Under this configuration, the SHE induced switching works in the same way as the conventional spin torque induced switching. Within a spin Hall effect ST-MRAM device in accordance with the embodiments, the spin current is generated using a non-magnetic material instead of a ferromagnetic material layer, such as but not limited to a ferromagnetic polarizer layer. When $\vec{m}_1$ is parallel with $\vec{\sigma}$, the spin current will make the current magnetization orientation more stable, and will not cause switching. Otherwise, when $\vec{m}_1$ is antiparallel with $\vec{\sigma}$, if the spin current is large enough, the magnetization of FL will be switched. Therefore, currents with opposite sign will inject spins with opposite orientation into the FL, and those opposite orientations will result in different preferable orientations of the FL magnetization, so a reversible deterministic switching can be realized by determining the direction of the electrical current through the SHE generating layer that is designated as the SHE base layer.

Figure 5:
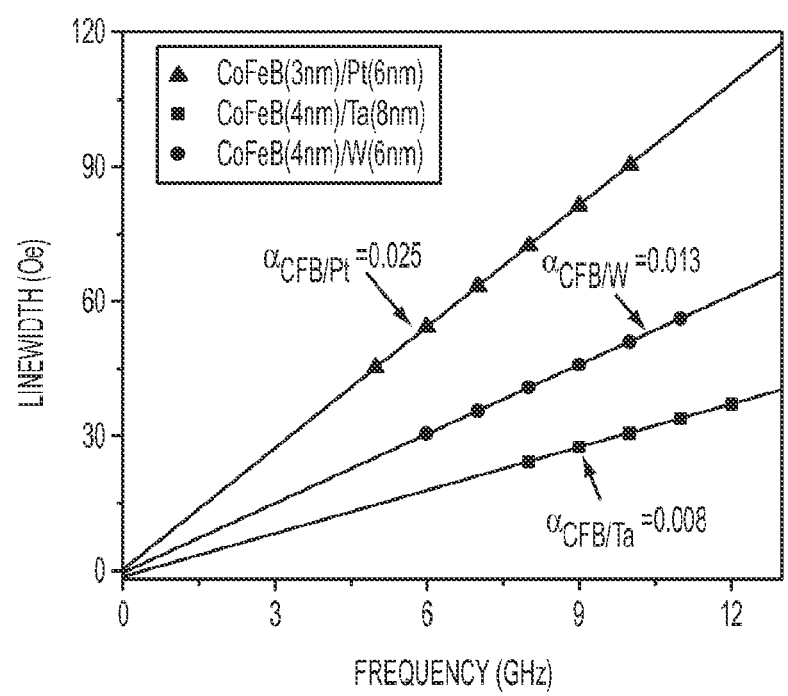
FIG. 5 shows the ferromagnetic resonance (FMR) linewidth obtained from CoFeB (3-4 nm) with Pt (6 nm), Ta (8 nm) or W (6 nm) under different frequencies. The damping coefficients α were obtained from linear fit of the data shown in FIG. 5.

Since the current required for switching of the FL when the FL and PL are magnetized in the plane of the films is linearly proportional to the effective magnetic damping of the free layer, the most efficient switching will occur when this effective damping is minimized. Thus it is highly preferable that the normal layer in which the SHE is generated be some material other than Pt. This is because by the process know as spin-pumping (S. Mizukami, Y. Ando and T. Miyazaki, J. Magn. Magn. Mater. 239, 42 (2002), Y. Tserkovnyak, A. Brataas, and G. E. W. Bauer, Phys. Rev. Lett. 88, 117601 (2002)), whereby the magnetic damping of a FL when in electrical contact with a Pt layer is greatly enhanced by spins diffusing across the interface from the FL into the Pt where the spin quickly relax. If for example Ta or W is employed to generate the SHE rather than Pt, the spin pumping effect is much less. FIG. 5 shows the magnetic damping of a ferromagnetic layer of CoFeB in contact with a thin layer of Pt as determined by ferromagnetic resonance and for comparison that of two similar bilayers, one consisting of a ferromagnetic film of CoFeB in contact with a Ta film, and the other a ferromagnetic film of CoFeB in contact with a W film. The magnetic damping of the CoFeB/Ta and CoFe/W bilayers is less than that of the CoFeB/Pt bilayer by approximately a factor of two or more, demonstrating the advantage of the use of Ta or W, or another SHE material with low spin relaxation rates, other than Pt for spin torque switching via an anti-damping spin torque.

The giant SHE in Ta, together with its small effect on the damping of adjacent magnetic layers, makes Ta an excellent material for effecting spin torque switching of an in-plane magnetized free layer in a magnetic tunnel junction. In conventional anti-damping spin torque switching where the spins are injected either nearly parallel or anti-parallel to the initial orientation of the local magnetic moment, the critical current density $J_{C0}$ for switching in the absence of thermal fluctuations can be approximately calculated as $$J_{C0} \approx \frac{2e}{\hbar} \mu_0 M_S t \alpha (H_C + M_{eff}/2)/(J_S/J_e),$$

where $M_S$, t, and $H_C$ represent the saturation magnetization, the thickness and the coercive field of the free layer, respectively.

Figure 6:
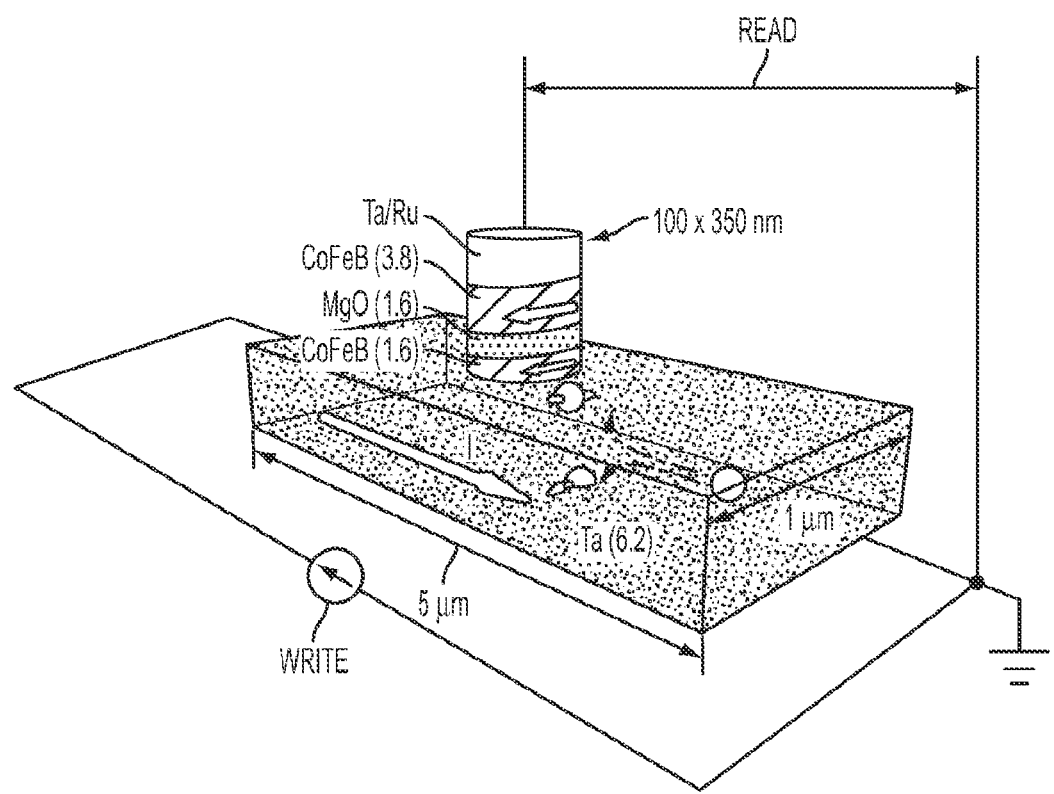
FIG. 6 shows a schematic diagram of a three terminal spin Hall effect device using a tantalum film as an SHE base layer.

To demonstrate in-plane magnetic switching induced by the spin Hall effect in Ta, a three-terminal device was fabricated, consisting of the multilayer: substrate/Ta(6.2)/CoFeB(1.6)/MgO(1.6)/CoFeB(3.8)/Ta(5)/Ru(5) (thicknesses in nm) patterned into the geometry illustrated in FIG. 6. The Ta bottom layer was patterned into a 1 µm wide and 5 µm long strip (with resistance 3 kΩ) and the rest of the layers were etched to form a magnetic tunnel junction (MTJ) nanopillar on top of the Ta with lateral dimensions ~100×350 nm, and with the long axis of the nanopillar perpendicular to the long axis of the Ta microstrip.

Figure 7:
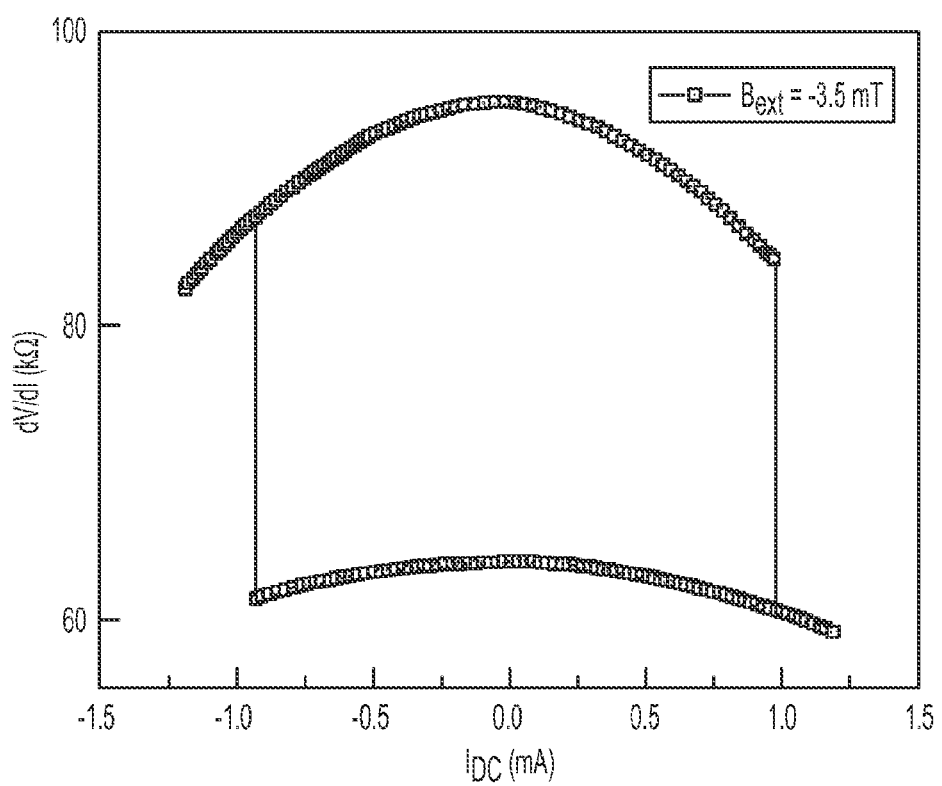
FIG. 7 shows experimental data obtained from a three terminal spin Hall effect device with a tantalum SHE base layer, demonstrating SHE induced magnetic switching at room temperature of an in-plane-magnetized ferromagnetic layer.

For the spin torque switching measurement a DC current $I_{Ta}$ was applied to flow through the Ta microstrip while the differential resistance dV/dI of the magnetic tunnel junction was monitored. FIG. 7 shows the abrupt hysteretic switching of the MTJ resistance that occurred when $I_{Ta}$ was swept through 1 mA, which resulted in antiparallel to parallel (AP-P) switching. This switching was reversed (P-AP switching) when the current was swept back past −1 mA. Note that during the spin-torque switching measurement a −3.5 mT in-plane magnetic field was applied along the long axis of the MTJ to cancel the magnetic dipole field from the top layer of the MTJ acting on the bottom layer. This biased the free layer of the junction at the midpoint of its magnetoresistance loop. In an SHE device that is optimized for memory cell application the top pinned layer will be, for example, a synthetic anti-ferromagnetic tri-layer that will be balanced to result in the net dipole field at the FL being close to zero, which will remove the need for the external in-plane field.

This 3-terminal SHE switching result demonstrates that a spin Hall effect as strong as that in beta-Ta can be very effective in switching the free layer of a magnetic tunnel junction without any substantial part of the switching current required to flow through the MTJ, which solves a major reliability issue associated with conventional 2-terminal ST-MRAM devices. Moreover this result demonstrates the important feature of this embodiment that the current required for switching the FL from being parallel (P) to being antiparallel (AP) to the PL is essentially the same as is required for switching in the opposite direction, AP to P, and of course the electrical impedance for the write operation is the same for both switching directions. This is in sharp contrast to the case of the 2-terminal MTJ spin torque device where the switching currents are quite different for the two switching directions, and the electrical impedance at the beginning of the write operation is also quite different for the two switching directions. These symmetric characteristics of the write operation in a 3-terminal SHE switched MTJ memory cell provide advantages for the design of magnetic memory circuits.

The SHE induced switching can also be realized with $\vec{m}_1$ and $\vec{m}_2$ oriented perpendicular to plane. In this configuration, the injected spins from the SHE $\vec{\sigma}$ are still along +/−x-axis while the equilibrium position for $\vec{m}_1$ is aligned along the +/−z axis. So, the direction of $\vec{m}_1$ and that of $\vec{\sigma}$ are perpendicular to each other and effect of the injected spins is no longer equivalent to an effective damping. Instead the effect of the spin torque can be described using an effective magnetic field $B_{ST}$. The spin torque per unit moment generated by injected spin current can be written as $$\vec{\tau}_{ST} = \frac{\hbar}{2eM_S t} J_S (\hat{m} \times \hat{\sigma} \times \hat{m}),$$

where $\hbar$, e, $M_S$ and t represent the Planck's constant, electron charge, saturation magnetization of the FL and the thickness of the FL, respectively, and $J_S$ is the spin current injected into the FL from the SHE. Meanwhile, the torque generated by a magnetic field in general can be written as $\vec{\tau} = -\hat{m} \times \vec{B}$. By comparing the form of the two torques, the effective magnetic field induced by the spin Hall effect has the form $$\vec{B}_{ST} = -\frac{\hbar}{2eM_S t} J_S \hat{\sigma} \times \hat{m}.$$

Figure 8A:
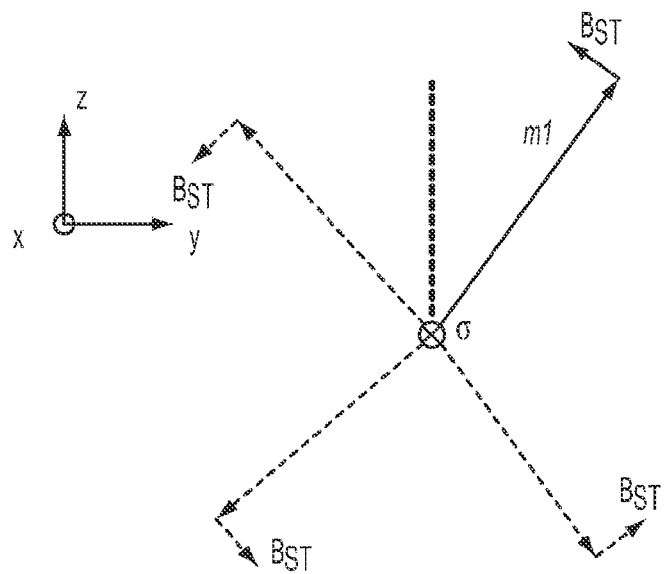
FIG. 8A shows a diagram illustrating the direction of an effective spin torque field $B_{ST}$ under different orientations of a FL magnetic moment. The injected spins are assumed to be along the −x direction as an example.
Figure 8B:
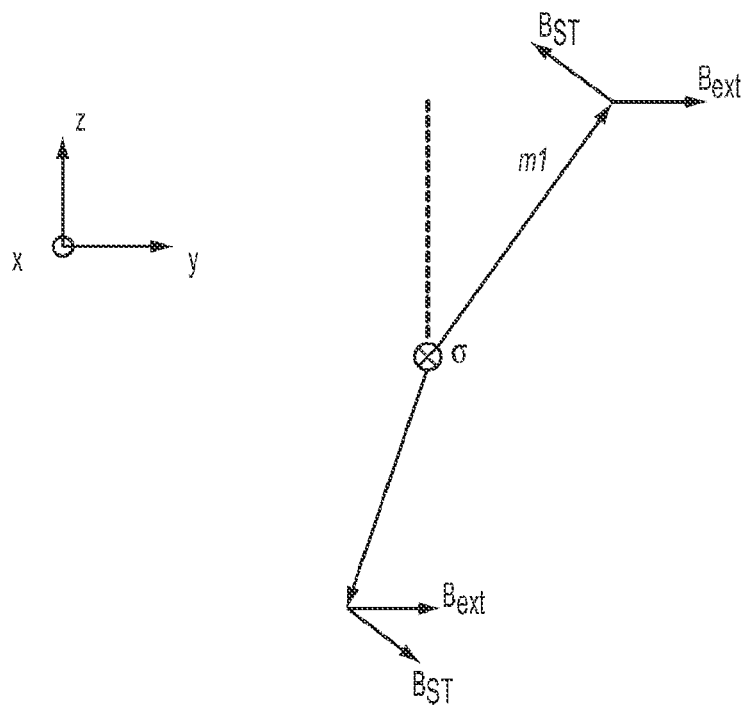
FIG. 8B shows a diagram illustrating the relationship between the direction of the effective spin torque field $B_{ST}$ and that of the applied field $B_{ext}$.
Figure 9:
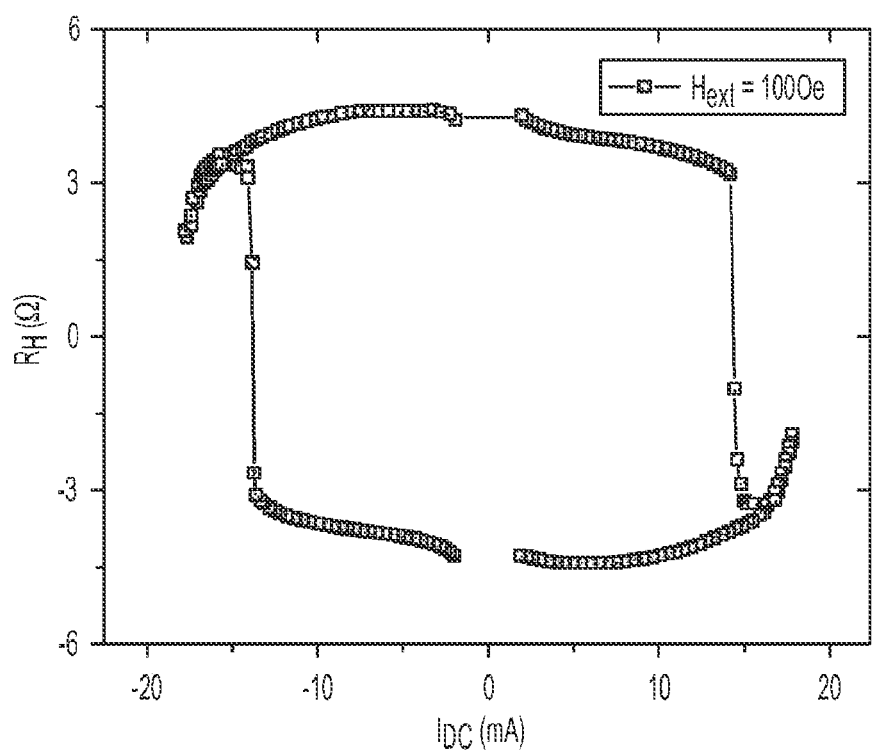
FIG. 9 shows experimental data obtained from a Pt/Co/Al multilayer, demonstrating SHE induced magnetic switching at room temperature of a perpendicularly-magnetized ferromagnetic layer.
Figure 10:
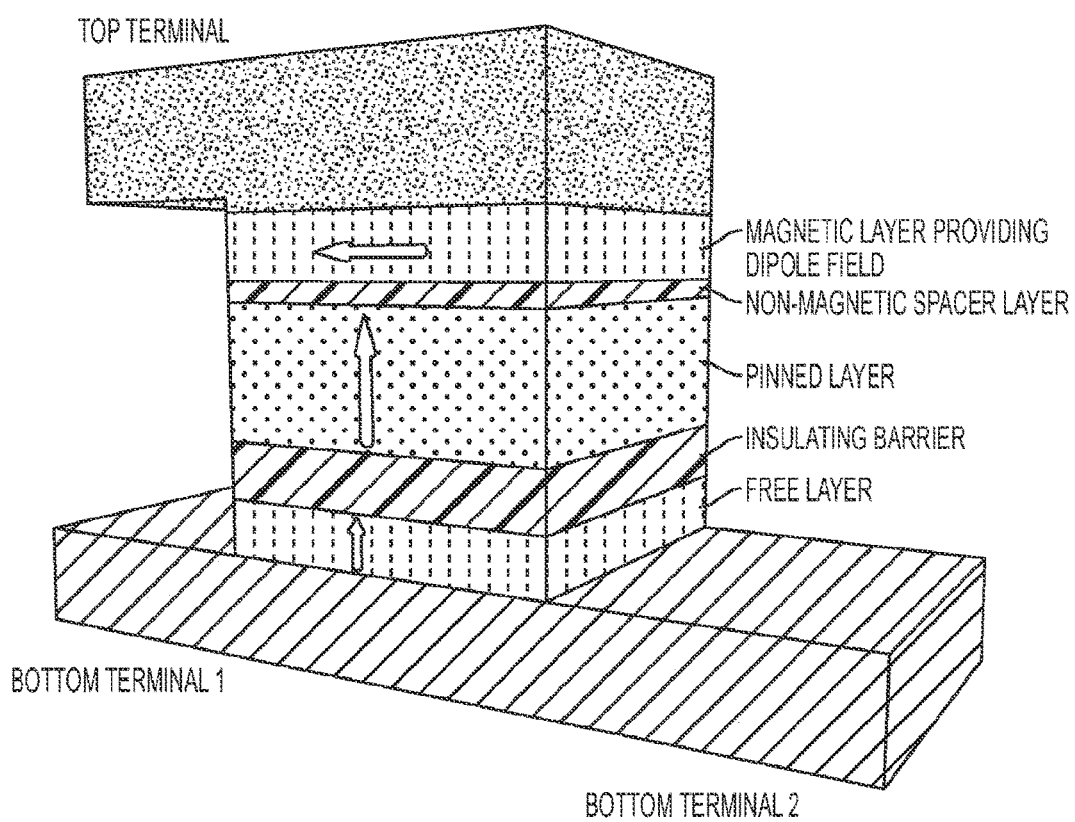
FIG. 10 is a variant of the structure shown in FIG. 3, which has an additional in-plane magnetized ferromagnetic material layer, providing the in-plane field needed for defining a definite switching direction.

Therefore, $\vec{B}_{ST}$ is always perpendicular to $\vec{m}_1$ and points clockwise or counterclockwise, depending upon the direction of the injected spins. FIG. 8A gives an illustration on the direction of $\vec{B}_{ST}$, when the injected spin $\vec{\sigma}$ is along the −x direction. If $J_S$ is large enough such that $|\vec{B}_{ST}| > 0.5 B_{an}^0$, where $B_{an}^0$ is the maximum anisotropy field that the magnetic film can provide, then $\vec{B}_{ST}$ will induce a continuous rotation of $\vec{m}_1$. In a multi-domain ferromagnetic layer, where the coercive field of the magnetic film $B_c$ is smaller than $B_{an}^0$, the corresponding requirement on $\vec{B}_{ST}$ can be loosened to approximately $|\vec{B}_{ST}| > 0.5 B_c$. Under the effect of $\vec{B}_{ST}$, $\vec{m}_1$ will be switched continuously, without a deterministic final state. So an external magnetic field has to be introduced in order to get a deterministic switching. In FIG. 8B, an external field in the +y direction is applied as an example. Using $m_z$ to represent the z component of $\vec{m}_1$, it can be seen that the state with $m_z > 0$ will become a stable state because $\vec{B}_{ST}$ and $\vec{B}_{ext}$ can be balanced out with each other while $m_z < 0$ states are still non-stable because $\vec{B}_{ST}$ and $\vec{B}_{ext}$ works in the same direction, causing $\vec{m}_1$ to continue to rotate. Therefore, under an applied field in the +y direction, spins injected in the −x direction can switch $\vec{m}_1$ into the $m_z > 0$ state. By reversing the writing current direction, spins from the SHE will be injected along +x direction, causing $\vec{m}_1$ to be switched into the $m_z < 0$ state. In conclusion, by using spins injected from the SHE, a reversible deterministic switching can be realized. The role of the external magnetic field $\vec{B}_{ext}$ is to break the symmetry of the system and to get a definite final state. The magnitude of this field can be as small as a few milli-Telsa (mT) as is demonstrated in the experiment. FIG. 9 shows the experimental result, which utilizes the spin current from the SHE to switch the magnetic moment at room temperature. The sample was formed by a 20 um wide, 2 nm thick Pt strip and a 0.7 nm Co magnetic layer in contact with the Pt strip, which has a perpendicular magnetic anisotropy, 1.6 nm of Al is utilized as the capping layer to protect the Co from oxidation by the atmosphere. The anomalous Hall effect is used to monitor the magnetization orientation of the Co layer. The x-axis in FIG. 9 represents the applied current in the Pt strip and the y-axis reflects the anomalous Hall resistance under corresponding current. It can be seen that under an external field of +10 mT, the magnetic moment of Co layer can be switched back and forth with opposite applied current. In the device configuration for an MRAM cells, in order to provide the required external field along the current flowing direction, an in-plane magnetized fixed magnetic layer of a few nanometers thickness can be added onto the top of the MTJ, as is shown in FIG. 10. The dipole field generated by this in-plane magnetic layer will give the current induced-switching a deterministic final state. Other configurations of ferromagnetic thin films can also be employed to generate this small external in-plane magnetic field.

Figure 11:
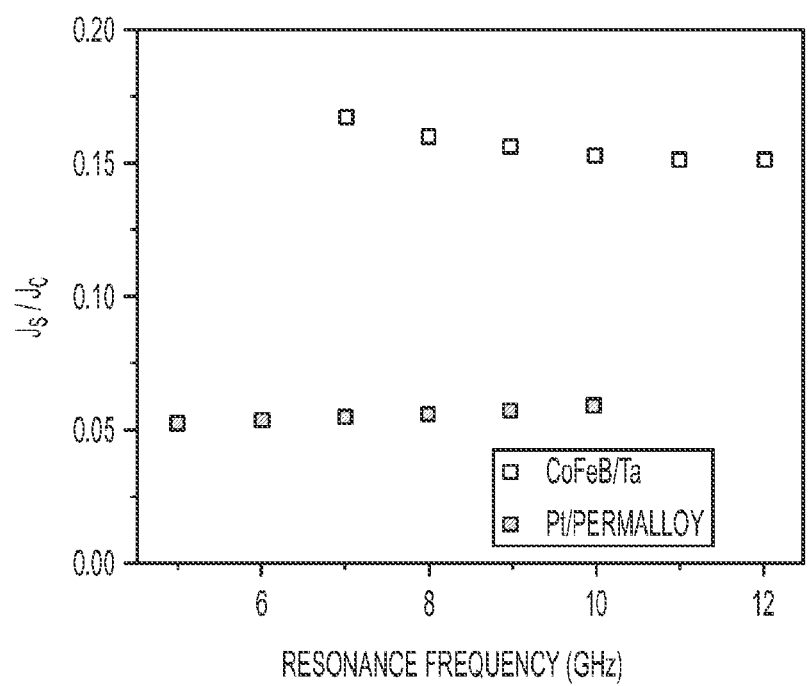
FIG. 11 shows a ratio between injected spin current and charge current for Ta and Pt separately. The results are obtained from spin torque ferromagnetic resonance experiments on CoFeB/Ta and Pt/Permalloy samples separately, under a series of driven frequencies.

While the damping enhancement or spin pumping effect of a Pt layer in contact with the FL does not cause an increase in the required switching current when the FL and PL are magnetized perpendicular to the plane of the film layers, in that configuration it still be preferable to use Ta, W, or some material other than Pt to generate the spin current by the spin Hall effect. That is because the efficiency of the SHE in Ta and W is much higher than that of Pt in generating a spin current from an applied electrical current. This is demonstrated in FIG. 11, where the ratios of the spin current density to the electrical current density are plotted for a NiFe/Pt bilayer and for a CoFe/Ta bilayer. The spin Hall efficiency for the Ta case is more than twice that for the Pt case and that for W in its beta phase is approximately twice that for Ta.

The writing operation can be realized by applying currents in the non-magnetic strip for magnetic tunnel junctions with both in-plane and perpendicular to plane magnetic anisotropy, as is discussed above. The reading operation should be similar with conventional ST-MRAM device. A sensing current across the insulating barrier will yield a different voltage signal, depending upon the relative orientation of the FL and PL.

Compared with the conventional ST-MRAM, one advantage of the MRAM cell employing the SHE as the writing mechanism is stronger torques per unit current. The SHE can provide a torque corresponding to a transfer or angular momentum greater than 1 unit of spin (h/2 pi) per electron in the applied current, where the torque in conventional ST-MRAM must always be weaker than 1 unit of transferred spin (h/2 pi) per electron in the current. A second advantage of the MRAM cell employing the SHE as the writing mechanism lies in that the writing current no longer passes through the tunnel barrier, which can greatly increase the lifetime of the memory cell and greatly eases the reproducibility margins needed to achieve reliable reading and writing. In conventional ST-MRAM, since both the writing and reading operation rely on the tunneling barrier, an undesirable trade-off has to be made in order to get a large tunneling magnetoresistance and at the same time allow for a large current to flow through the barrier. In many cases, the requirement of those two cannot be satisfied simultaneously. In contrast, in the three-terminal MRAM cell that uses the SHE as the writing mechanism, the performance of the MTJ can be optimized just for the reading operation. Therefore one gains considerable freedom in the design of the MTJ, for example, the thickness of the tunnel barrier can be adjusted to get the optimum tunneling magnetoresistance and the appropriate impedance match with the circuitry that provides the write currents and the circuitry that reads the sensing voltage.

An ST-MRAM in accordance with the embodiments has an advantage of simplicity of fabrication. The ST-MRAM in accordance with the embodiments separates the writing current and the reading current without adding significant complexities into a fabrication process. Only a single nanometer scale pillar is fabricated in the ST-MRAM structure shown in FIGS. 1-3.

In the ST-MRAM device geometries discussed thus far in FIGS. 1-3 and FIG. 10, the thin film magnetic free layer is of limited lateral extent and hence contains (approximately) a single magnetic domain, whose two possible net magnetization directions are indicated by the arrows in the relevant FIGS. 1-3 and FIG. 10. In another category of ST-MRAM magnetic memory device in accordance with the embodiments, the magnetic free layer consists of a long wire or wire segment in which information is stored via the positions of magnetic domain walls which separate domains with different magnetization directions.

Figure 12:
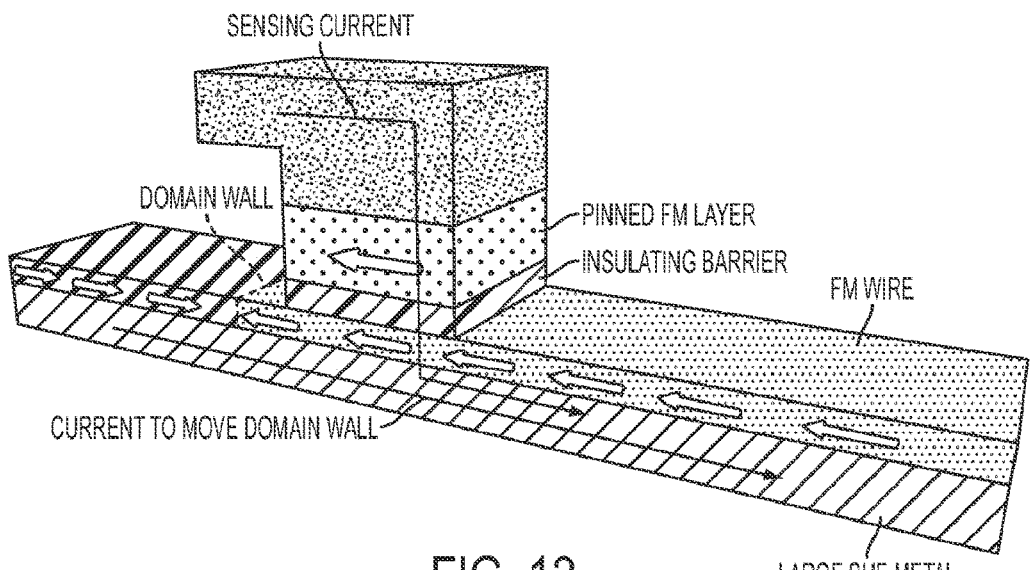
FIG. 12 shows a schematic diagram of a magnetic data storage device that stores information in magnetic domains and that uses the SHE as a writing mechanism. The magnetic moment for both the FM wire and the pinned layer of the MTJ are magnetized in-plane.
Figure 13:
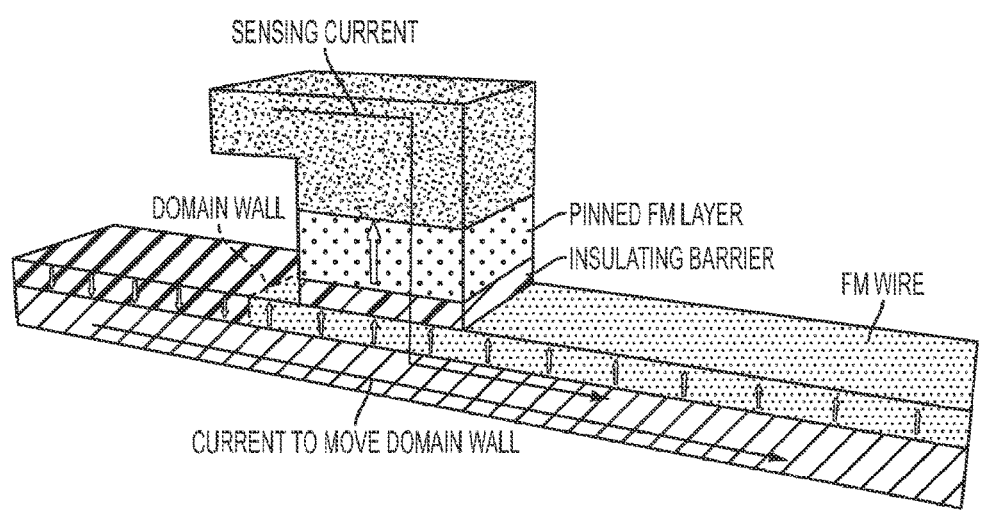
FIG. 13 is a variant of the structure shown in FIG. 12, which has perpendicular to plane magnetic anisotropy.

To that end, the embodiments also propose to use the torque from the SHE to enhance the ability of an electrical current to manipulate the positions of magnetic domain walls by using samples in which the magnetic free layer wire is in contact with a non-magnetic thin film that exhibits a strong SHE, in combination with a pinned magnetic layer to read out the magnetic orientation of the free layer, as illustrated in FIG. 12 and FIG. 13. The current may flow laterally parallel to the sample plane or a lateral current may be applied in combination with a vertical current. The torque from the SHE may directly assist in moving the domain wall and it may also stabilize the configuration of the domain wall enabling it to be moved at greater velocity and improved efficiency compared to the influence of the conventional spin transfer torque effect alone.

III. Specific Materials Considerations Related to the Spin Hall Effect in the ST-MRAM Device Structures in Accordance with the Embodiments In accordance with section I., above, there are at least three materials parameters related to the materials properties of the spin Hall effect base layer within which the spin Hall effect (SHE) occurs that can be optimized for efficient switching of a free layer magnetic element by the spin torque exerted by the SHE generated spin current.

First, the conversion efficiency from the charge current to spin current depends on the spin Hall angle, $\theta_{SH} = J_S(\infty)/J_e$, which is the ratio of the generated transverse spin current density to the applied longitudinal electrical current density. This is an intrinsic property of conducting materials, which varies from material to material and as a function of materials quality for a given material. A large spin Hall angle corresponds to large spin current generation efficiency. For example, W, Ta, and Pt have quite large spin Hall angles. Other metallic elements or alloys have the potential to have a large spin Hall angle. Conducting films formed from metallic elements, alloys, and compounds that incorporate high atomic number elements, and conducting films doped with high atomic number dopants with strong spin-orbit scattering such as Au doped with Pt or Cu doped with Ir or Bi may also have a large spin Hall angle.

A second parameter is the spin diffusion length $\lambda_{SF}$ of the nonmagnetic material that is used to generate the transverse spin current via the SHE. The spin diffusion length is the length scale over which a non-equilibrium spin density relaxes back to equilibrium within the material. The spin current generation efficiency is optimized when the spin diffusion length is comparable to or smaller than the thickness of the non-magnetic thin film nanowire d in the schematic drawings of the device (see, e.g., FIG. 1, FIG. 3 and FIG. 10), according to the equation $[J_S(\infty)/J_{e,SHM}][1-\mathrm{sech}(d/\lambda_{SF})]$. So, for the SHE writing mechanism to work with the highest efficiency, one will typically desire a spin diffusion length as small as possible. One approach is to utilize a highly resistive metal with a high spin Hall angle and a short elastic mean free path l for its conduction electrons as the spin diffusion length scale directly with $l^{1/2}$.

A large spin Hall angle and short spin diffusion length are beneficial for an MRAM cell with the magnetic moment of the free, reversible, layer, lying either in-plane or perpendicular-to-the-plane, the two cases demonstrated in FIG. 1 and FIG. 3 respectively. For the latter case of the free layer magnetized perpendicular to the plane, the electrical, or charge, the minimum current required to initiate the spin torque switching of a thermally stable (anisotropy energy=40 $k_B$T) perpendicularly polarized magnet is given approximately by $$I_c = \frac{2e(40k_BT)[d + (\sigma_F/\sigma_{SHM})t]}{\hbar L(J_S(d=\infty)/J_{e,SHM})[1-\mathrm{sech}(d/\lambda_{sf})]} \frac{M_S(|I_c|)B^0_{an}(|I_c|)}{M_S(I=0)B^0_{an}(I=0)}.$$

Here $J_S(d=\infty)/J_{e,SHM}$ is the spin Hall angle, d is the thickness of the non-magnetic metal layer M within which the SHE acts to generate the transverse spin current, t is the thickness of the free layer magnet, L is the length of the free layer magnet in the direction of the electrical current flow, $k_B$ is the Boltzmann constant, T is the absolute temperature of the device, $\sigma_F$ is the electrical conductivity of the free layer magnet, $\sigma_{SHM}$ is the conductivity of the non-magnetic layer, $\lambda_{sf}$ is the spin diffusion length within the layer generating the spin Hall effect, $M_S(|I_c|)$ is the saturation magnetization of the free layer magnet which may vary with current due to ohmic heating, and $B_{an}^0$ is the effective anisotropy field of the perpendicularly-polarized free layer. The anisotropy field $B_{an}^0$ should be just large enough to ensure thermal stability of the free layer ferromagnet. The switching current is clearly minimized when the spin Hall angle is maximized and the spin diffusion length minimized.

A third material parameter of importance to the optimization of the writing of data in an ST-MRAM cell via the SHE is the degree to which the presence of the spin Hall metal will increase the magnetic damping coefficient ($\alpha$) of an adjacent magnetic layer, e.g., through the spin-pumping effect. Minimizing this increased damping is required in order to minimize the electrical current necessary to effect the magnetic reversal of the free layer ferromagnet in MRAM devices where the magnetic moment is magnetized in the film plane, as is the case shown in FIG. 1. Some materials with a large spin Hall angle, such as Pt, induce a large amount of unwanted excess damping, while other materials with a large spin Hall angle, such as W and Ta are preferable because they add much less damping. The minimum current needed to switch a thermally-stable in-plane magnetized free layer is given approximately by:

$$I_c \approx \frac{\frac{2e}{\hbar}\alpha\frac{d}{L}\left[\frac{M_S(I_c)H_k(I_c)}{M_S(0)H_k(0)}2(40k_BT) + \frac{\mu_0[M_S(I_c)Vol]M_{eff}(I_c)}{2}\right]\left[1 + \frac{\sigma_F}{\sigma_{SHM}}\frac{t}{d}\right]}{[J_S(d=\infty)/J_{e,SHM}][1 - \text{sech}(d/\lambda_{SF})]}.$$

Here Vol is the volume of the free layer magnet, $\mu_0$ is the permeability of free space, $H_k(I)$ is the in-plane coercive field of the free layer magnet and $M_{eff}(I)$ is effective demagnetization field of the free layer magnet, both of which may vary with current due to heating effects. Thus for the case of MRAM cells with in-plane magnetized free layers there is direct benefit of enhanced efficiency for SHE induced switching by utilizing a material to generate the transverse spin current that has a large as possible spin Hall angle, as short as possible spin diffusion length, and a low value of the damping parameter $\alpha$ for the magnetic free layer in contact with the spin Hall metal. With materials whose properties, including the spin Hall angle, have already been characterized it is straightforward to calculate that efficiency of magnetic reversal by the SHE can be quite comparable to best values achievable with conventional spin torque switching. Together with this excellent efficiency, the greater reliability and ease of fabrication of a SHE ST-MRAM device makes it substantially superior for high performance, non-volatile magnetic memory applications.

IV. Additional Considerations Related to Tungsten as an SHE Base Layer in ST-MRAM Device Structures in Accordance with the Embodiments As discussed above the spin Hall effect that arises from the current that flows in a thin normal metal strip of the proper type can efficiently effect the magnetic excitation and reversal of polarity of a small nanoscale ferromagnet that is placed adjacent to, and in electrical contact with the normal metal strip. While not being bound by any particular theory of operation of the embodiments, it is believed that this is due to the spin-orbit interaction of the conduction electrons in metals with high atomic number Z, electrons having one spin orientation are deflected preferentially in one direction that is transverse to the direction of electron current flow and those electrons with their spin orientation in the opposite orientation are deflected in the opposite transverse direction. The result is a diffusion of spin-polarized electrons to the two opposing surfaces of the normal metal strip, which is known as the spin Hall effect. This "spin current" when it impinges onto the surface of the nanomagnet placed on the surface of the film microstrip can exert a spin torque on the nanomagnet through the now well known phenomena of spin transfer. This occurs because the quantum mechanical angular momentum of the electrons entering or reflected from the nanomagnet that is transverse to the local moment of the nanomagnet has to be absorbed by that moment.

Discussed above is also how the spin Hall effect in Pt and in Ta thin films can be strong enough to effect magnetic reversal in a manner suitable for application in nanoscale magnetic memory cells. In general the more efficient the conversion of electrical current density to transverse spin current density the better the overall effectiveness of the device. The ratio of the transverse spin current density $J_s$ to the longitudinal electrical current density $J_e$ is known as the spin Hall angle $\theta = J_s/J_e$. Equivalently one may describe the spin Hall angle as $\theta = \sigma_s/\sigma_e$, where $\sigma_s$ is the transverse spin conductivity and $\sigma_e$ is the longitudinal electrical conductivity. In accordance with above disclosure the spin Hall angle for high resistivity Ta thin film microstrip in the so-called beta phase can be $\geq 0.15$.

To maximize $\theta$ it is necessary to utilize a material with a strong spin orbit interaction. In the case of a metallic system where the electron mean-free-path between elastic collisions in the metal in question is quite short the spin Hall effect is expected to be in the so-called intrinsic regime. In that case the electrical conductivity $\sigma_e$ decreases linearly with electron mean-free-path but the transfer spin conductivity $\sigma_s$, which depends only on the interaction of the conduction electron with the atomic electron orbitals about the high Z atoms in the metal is independent of the mean free path. Thus $\theta$ can be quite large if there is a large spin-orbit interaction in a low conductivity metal.

Figure 14:
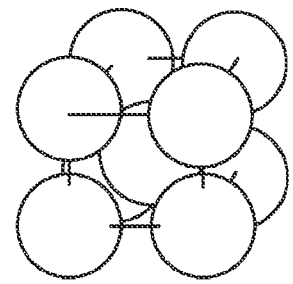
FIG. 14 shows crystal structure, resistivity and stability characteristics of alpha-phase tungsten and beta-phase tungsten.
Figure 14:
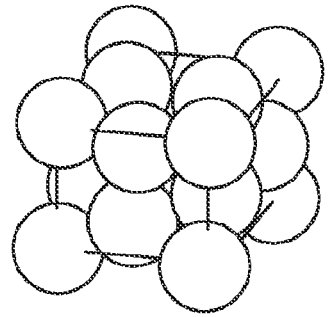
Figure 15:
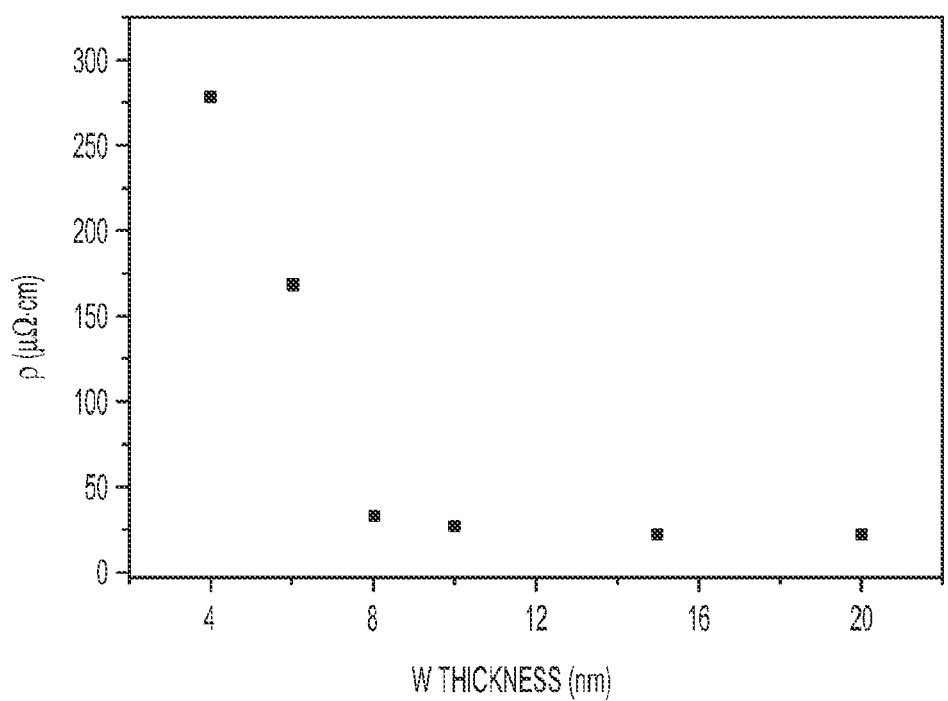
FIG. 15 shows resistivity of tungsten thin films as a function of thickness using DC magnetron sputter deposition.

As an example, one may determine that the spin Hall angle in tungsten W thin films that have been produced in a manner such as to be at least partially in the beta-W phase, which is generally believed to have the A15 crystal structure and is relatively highly resistive, can be of order 0.3 and possibly higher. The alpha-W phase is in the body-centered-cubic crystal structure and is of considerably lower resistivity. See, e.g. FIG. 14. The beta-W phase is stable in very thin, thickness $\leq 10$ nm, W layers may be produced by magnetron sputtering in high vacuum and also by other means. Depending upon the method of production, thickness and post-deposition processing the W film can be nearly 100% in the beta phase, in a mixed alpha and beta phase or in the pure alpha phase, with the resistivity ranging from over 200 microOhm-cm in the beta phase to less than 30 microOhm-cm in the alpha phase. An example of the variation in resistivity with thickness and processing is shown in FIG. 15.

Figure 16:
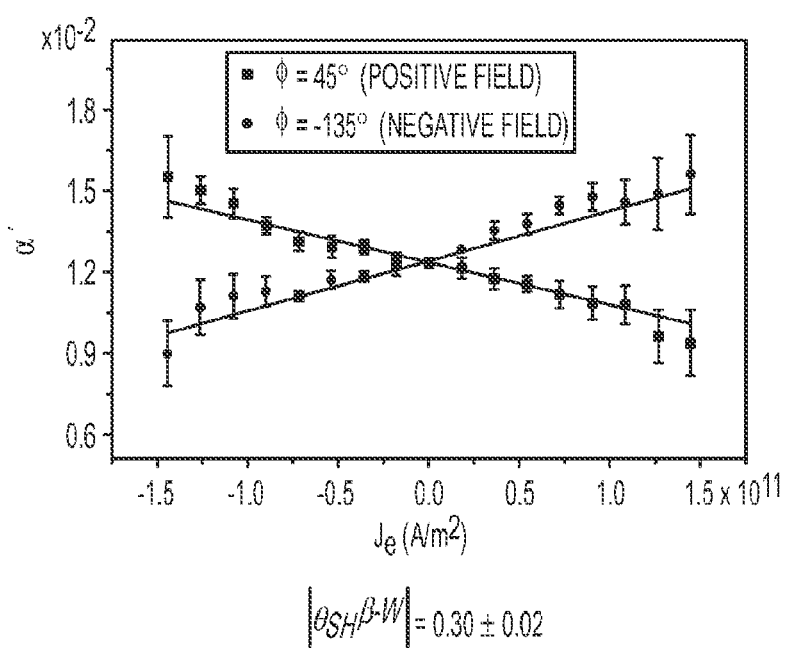
FIG. 16 shows the graphical results of measurements of a spin Hall angle in a 6 nanometer thick tungsten film.

To determine the strength of the spin Hall effect in a given material, the most straightforward approach is to produce a thin microstrip layer of the materials in question and then deposit a thin ferromagnetic layer on top. One may then pass a microwave current through the bilayer in the presence of a variable applied magnetic field. As the field amplitude is varied at the proper combination of frequency and field a ferromagnetic resonance (FMR) excitation can be generated within the ferromagnetic material, which can be detected via the anisotropic magnetoresistance effect. There are two ways the resonance can be generated. The first is due to the magnetic field generated by the portion of the current that flows in the spin Hall material, the second by the transverse spin current from the spin Hall effect that generates a spin torque, via the spin transfer effect, on the ferromagnetic layer when the spin current impinges on it. The symmetry of the FMR response as the function of field is antisymmetric about the resonance field for the magnetic field response but is symmetric from the spin Hall effect. This allows a direct calibration of the strength of the SHE. In addition an independent measure of the strength of the spin Hall effect is to determine the linewidth of the FMR signal as the function of a dc current flowing through the bilayer microstrip. Depending on the direction of the electrical current flow, the SHE either linearly increases the effective damping of the ferromagnetic resonance, hence narrowing or broadening the linewidth as the function of field. This can provide a second method of determining the spin Hall angle. An example of the results of such measurements with a W film is shown in FIG. 16.

Figure 17:
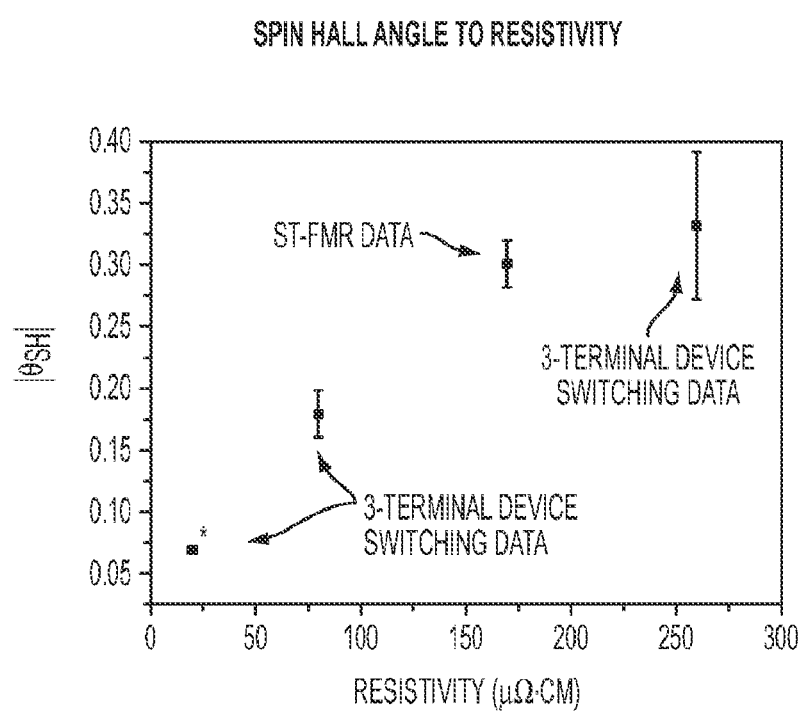
FIG. 17 shows the results of spin Hall angle measurements of three different tungsten films from FMR data and one tungsten film from switching data.

Several W samples have been studied in this way. Depending upon the processing of the film and its thickness one may determine that the spin Hall angle of a W material is quite large, and can be much larger than found with Ta. The results appear to vary at least linearly with the W resistivity and perhaps more rapidly. See FIG. 17.

Figure 18:
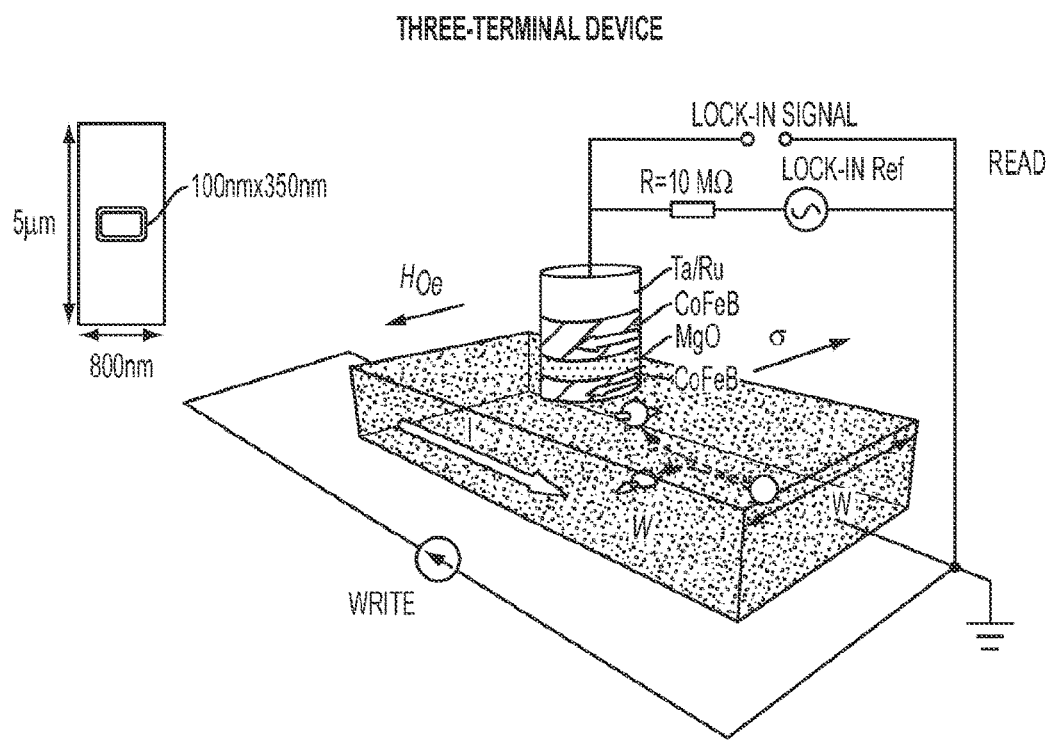
FIG. 18 shows a schematic diagram of a three terminal spin Hall effect device using a tungsten film as an SHE base layer.
Figure 19:
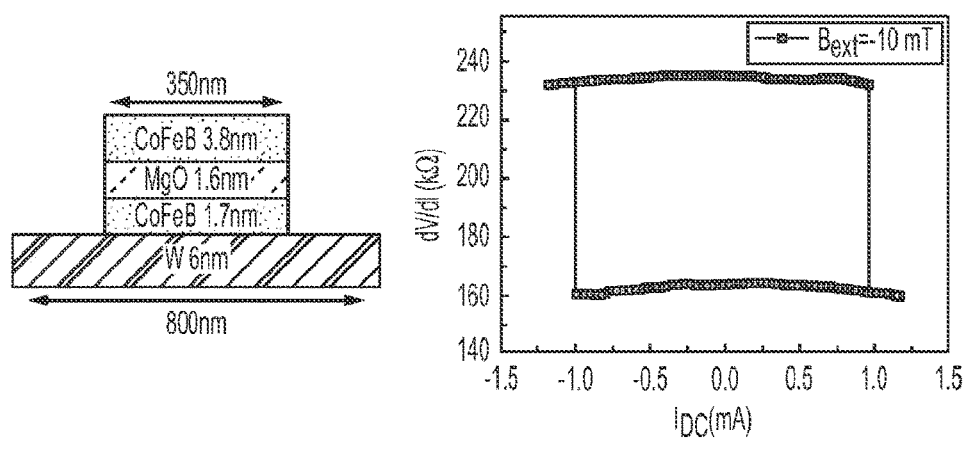
FIG. 19 shows at left a schematic diagram of a spin Hall effect memory element, and at right spin Hall effect switching behavior at room temperature for a three terminal spin Hall effect device that utilizes a 6 nanometer thick tungsten film layer.
Figure 20:
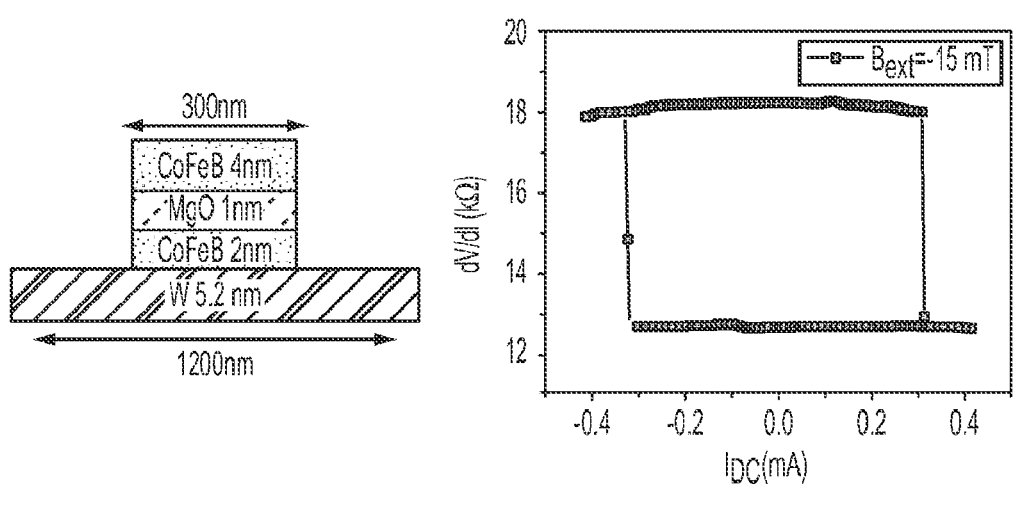
FIG. 20 shows at left device parameters, and at right spin Hall effect switching behavior at room temperature for a three terminal spin Hall effect device that utilizes a high resistivity 5.2 nanometer thick tungsten film layer.

To demonstrate in practice the efficacy of the spin Hall effect in W films to effect the writing, or magnetic reversal, of a free layer within an ST-MRAM magnetic memory cell one may fabricate a magnetic tunnel junction on a thin W thin film strip, as shown schematically in FIG. 18. As illustrated in FIG. 19 and FIG. 20, depending on the W sample and resistivity, direct electrical currents as small as 350 microamps passing through the W strip can reverse the magnetic orientation of the bottom ferromagnetic free layer electrode of the magnetic tunnel junction and hence switch the resistance of the tunnel junction from the low to high resistance state, or vice versa depending on the direction of the current flown through the W strip. Still lower currents can be sufficient for reversing the magnetic orientation of the ferromagnetic free layer of a magnetic tunnel junction if the width of the strip of spin Hall material is minimized to be close to that of the tunnel junction, and/or if the perpendicular magnetic anisotropy field $H_K$ of the free layer is reduced to be of the order of 1000 Oe (0.1 mTelsa) or lower.

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein may be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A magnetic device based on a spin Hall effect and a spin transfer torque effect, comprising:
   a three-terminal magnetic circuit that includes (1) a magnetic structure including a conductor layer located over a substrate and configured to exhibit a large spin Hall effect to react to a charge current flowing in the conductor layer to produce a spin-polarized current that is transverse to the charge current; and a magnetic free layer located over the substrate and the conductor layer to be in electrical contact with the conductor layer to receive the spin-polarized current, wherein the conductor layer has a thickness that is greater than or equal to a spin diffusion length in the conductor layer; (2) a first electrical contact formed at a first location of the conductor layer of the magnetic structure; (3) a second electrical contact formed at a second, different location of the conductor layer of the magnetic structure; and (4) a third electrical contact formed on one end of the magnetic structure that opposes another end in electrical contact with conductor layer;
   a first circuit coupled to the first and second electrical contacts of the three-terminal magnetic circuit to supply the charge current flowing in the conductor layer; and
   a second circuit coupled to the third electrical contact and either one of the first and second electrical contacts to direct a current through the magnetic structure between the third electrical contact and either one of the first and second electrical contacts.

2. The device as in claim 1, wherein:
   the second circuit applies a sensing voltage or current to the magnetic structure across layers of the magnetic structure.

3. The device as in claim 1, wherein:
   the first circuit is structured to supply the charge current as a substantial portion of a write current that flows only in the conductor layer to cause a change in a magnetization direction of the magnetic free layer via the spin-polarized current injected into the magnetic structure without having a substantial portion of the write current to be injected to flow across the magnetic free layer.

4. The device as in claim 1, wherein:
the magnetic structure including the magnetic free layer includes a spin valve.

5. The device as in claim 1, wherein:
the magnetic structure including the magnetic free layer includes a magnetic tunneling junction.

6. The device as in claim 5, wherein
the first circuit is structured to supply the charge current as a substantial portion of a write current that flows only in the conductor layer to cause a change in a magnetization direction of the magnetic free layer via the spin-polarized current injected into the magnetic tunneling junction without having a substantial portion of the write current to be injected to flow across the magnetic free layer to be supplied by the second circuit.

7. The device as in claim 5, wherein:
a thickness of a tunnel barrier of the magnetic tunneling junction is set at a thickness value for an impedance match in the first and second circuits.

8. The device as in claim 1, wherein:
the thickness of the conductor layer is no greater than 5 times of the spin diffusion length in the conductor layer.

9. The device as in claim 1, wherein:
the magnetic free layer is magnetically polarized in-plane with respect to the substrate; and
a damping factor of the magnetic free layer is increased by a factor less than about 2 by contact with the conductor layer.

10. The device as in claim 1 wherein:
the magnetic free layer is magnetically polarized perpendicular with respect to the substrate.

11. The device as in claim 10, wherein:
the magnetic structure is structured to make a contribution to the perpendicular magnetic anisotropy of the magnetic free layer suitable to achieve a total anisotropy energy of the magnetic free layer between 40 kBT and 300 kBT in connection with the presence of the conductor layer.

12. The device as in claim 1 wherein the conductor layer comprises at least one of Pt, Pd, Nb, Mo, Ru, Re, Os, Ir, Au, Tl, Pb or Bi conductor materials, and alloys of the foregoing conductor materials.

13. The device as in claim 1, wherein:
the conductor layer includes a tantalum material.

14. The magnetic structure of claim 13, wherein:
the tantalum material includes a beta phase tantalum material.

15. The device as in claim 1, wherein:
the conductor layer includes a tungsten material.

16. The device as in claim 15, wherein:
the tungsten material includes a beta phase tungsten material.

17. The device as in claim 1, wherein:
the magnetic structure includes a non-magnetic spacer layer located over the side of the free layer opposite the conductor layer, and a magnetic pinned layer located over the side of the non-magnetic spacer layer opposite the magnetic free layer, the magnetic pinned layer exhibiting a fixed magnetization.

* * * * *